United States Patent [19]
Ficker

[11] Patent Number: 5,905,755
[45] Date of Patent: May 18, 1999

[54] METHOD AND CIRCUIT FOR DATA REGENERATION OF A DATA STREAM

[75] Inventor: Manfred Ficker, Kanata, Canada

[73] Assignee: Northern Telecom Limited, Montreal, Canada

[21] Appl. No.: 08/682,127

[22] Filed: Jul. 17, 1996

[51] Int. Cl.[6] .................................................. H04B 17/02
[52] U.S. Cl. .......................................... 375/213; 364/486
[58] Field of Search ........................... 375/213; 364/486; 379/372, 283, 386

[56] References Cited

U.S. PATENT DOCUMENTS

| | | | |
|---|---|---|---|
| 3,917,912 | 11/1975 | Niwa | 179/84 |
| 3,934,097 | 1/1976 | Carbrey | 179/84 |
| 3,958,133 | 5/1976 | Albano et al. | |
| 4,016,370 | 4/1977 | Laoteppitaks et al. | 179/84 |
| 4,016,371 | 4/1977 | Hammad | 179/84 |
| 4,211,897 | 7/1980 | Ichikawa et al. | 179/84 |
| 4,486,752 | 12/1984 | Chihak | |
| 5,357,560 | 10/1994 | Nykerk | 379/59 |
| 5,572,588 | 11/1996 | Weng et al. | 379/386 |
| 5,619,564 | 4/1997 | Canniff et al. | 379/386 |
| 5,638,436 | 6/1997 | Hamilton et al. | 379/351 |

FOREIGN PATENT DOCUMENTS

| | | |
|---|---|---|
| 0327767 | 8/1989 | European Pat. Off. |
| 58-186218 | 10/1983 | Japan |

*Primary Examiner*—Stephen Chin
*Assistant Examiner*—Mohammad Ghayour
*Attorney, Agent, or Firm*—Thomas Vigil; Achmed Sadik

[57] ABSTRACT

Method and circuit for deciding whether or not a pulse in a data stream is or is not a valid pulse of the data stream, wherein a free-running local clock at N-times the data rate is generated and clock pulses thereof are counted once the data stream signal reaches and remains above a slicing threshold. Once a predetermined minimum number of counted clock pulses is attained a valid data pulse signal is issued.

14 Claims, 3 Drawing Sheets

5,905,755

METHOD AND CIRCUIT FOR DATA REGENERATION OF A DATA STREAM

CROSS-REFERENCE TO RELATED APPLICATION

This application is related to concurrently filed, commonly assigned, application entitled METHOD AND CIRCUIT FOR CLOCK RECOVERY FROM A DATA STREAM, which is incorporated herein by reference, application Ser. No. 08/652,398 filed on Jul. 17, 1996, now abandoned.

BACKGROUND OF THE INVENTION

1. Field of the Invention

The present invention relates to digital data circuits in general, and in particular to methods and circuits for the recovery and generation of data pulses of an incoming digital data stream. More particularly still, it relates to a method and circuit for deciding that an incoming pulse is a valid data pulse or that it is not; and if it is valid, a valid pulse signal (VPS) is produced. More particularly yet, the recovered system clock is combined with the VPS to provide regenerated data pulses. Where required for bipolar data pulses, a polarity sensor is provided prior to data regeneration.

2. Prior Art of the Invention

Conventionally an edge of the recovered system clock (RCLK) was used to clock the output of a comparator (or comparators in the case of bipolar P&NDATA) into a flip-flop (F-F). This required that the recovered clock edge be centered precisely on the data pulses for optimum data recovery when the data stream is degraded by noise, interference and/or jitter.

SUMMARY OF THE INVENTION

The present invention endeavours to provide a method and circuit to reduce sensitivity to clock phasing (the centering of clock edges) and increase tolerance to degradation due to noise interference and jitter on the incoming data stream.

In a broad aspect, the present invention provides a method for deciding whether a pulse is or is not a valid data pulse of an incoming data stream, comprising the steps of:

(a) conditioning the incoming data stream in a predetermined manner;

(b) counting clock pulses of a clock having a clock rate that is a multiple of the incoming data stream rate;

(c) commencing the counting in step (b) only when, and as long as, a predetermined signal threshold is attained by the incoming data stream conditioned in step (a); and (d) generating a valid pulse signal (VPS) when the clock pulses counted in step (b) have attained a predetermined number.

In another broad aspect of the present invention, a method is provided for regenerating data pulses of an incoming data stream, comprising the steps of:

(a) conditioning the incoming data stream in a predetermined manner;

(b) generating a valid pulse signal (VPS) from the incoming data stream conditioned in step (a); and (c) producing a regenerated data pulse of said incoming data stream, in response to a clocking pulse of a regenerated data stream clock, only upon occurrence of a VPS generated in step (b).

A circuit according to the present invention for generating a valid pulse signal (VPS) comprises: a pulse counter (i.e. a shift register, counter or divider) adapted to count up to a predetermined number at a predetermined clock rate; means for causing said counter to start counting in response to presence of a pulse exceeding a predetermined threshold; and means for resetting said counter in response to one of: said counter generating a VPS upon attaining said predetermined count, and said counter being disabled before reaching Terminal Count TC.

A circuit according to the present invention for regenerating data pulses of an incoming data stream, comprises: means for generating a valid pulse signal (VPS) indicating presence of a data pulse of said incoming data stream; and means for producing a regenerated pulse in response to presence of a VPS and a clocking pulse of a regenerated data stream clock.

BRIEF DESCRIPTION OF THE DRAWINGS

The preferred embodiments of the present invention will now be described in detail in conjunction with the annexed drawings, in which.

DETAILED DESCRIPTION OF THE PREFERRED EMBODIMENTS

Figure 1:
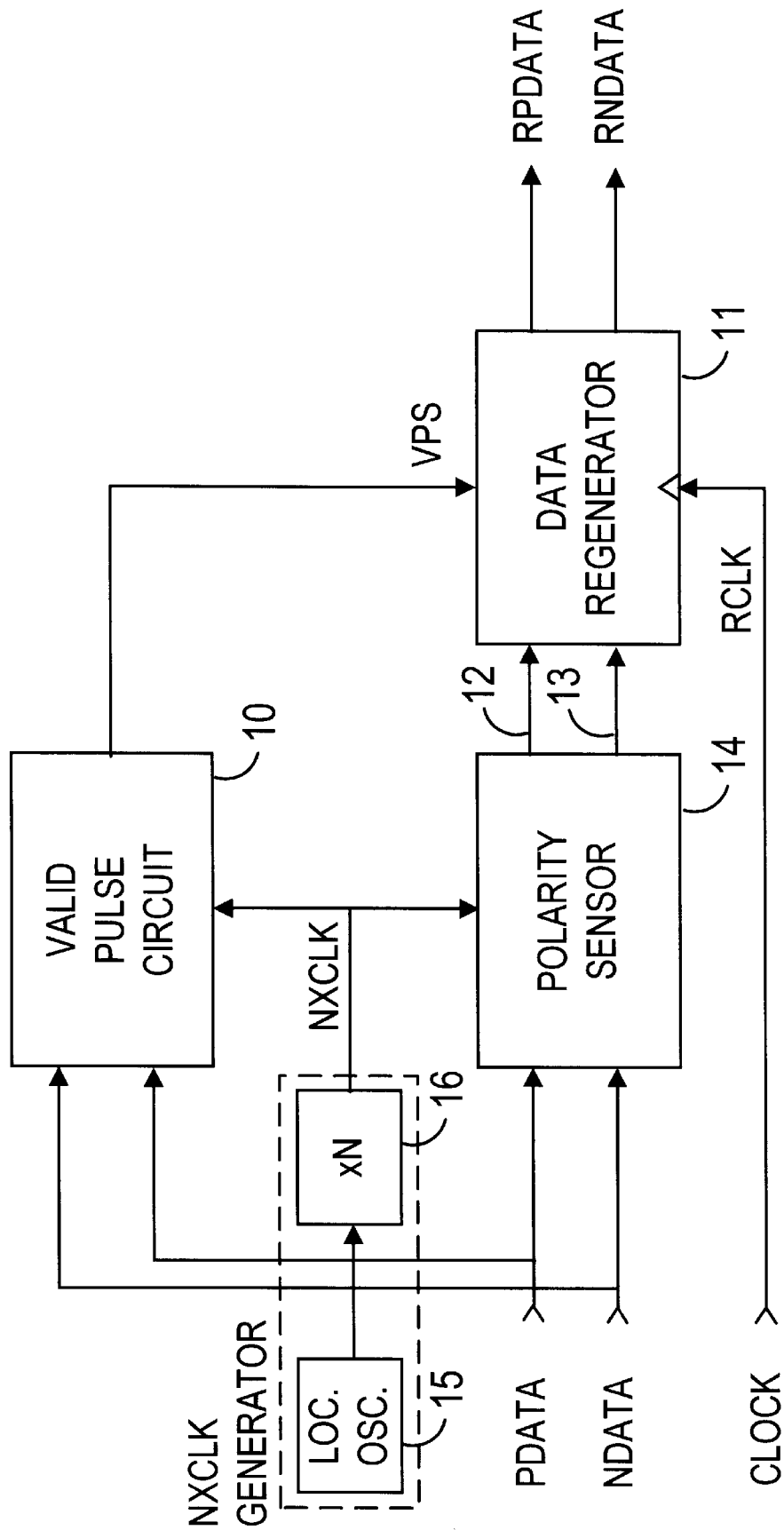
FIG. 1 is a high level block schematic explaining the method and circuit of the present invention.

Referring now to FIG. 1 of the drawings, the overall circuit for data regeneration of a separated bipolar data stream, which comprises a valid pulse circuit 10 having two inputs, one receiving pulses representing positive going "1s" PDATA and one receiving negative going "1s" NDATA; the assumption being that the bipolar data have been converted to two streams in the conventional manner by using, e.g. amplifier/comparators and a "slicing" voltage reference threshold. The output of the circuit 10 is a valid pulse signal VPS, which is applied to data regenerator 11, which is being clocked by the recovered data stream clock RCLK (RCLK is synchronous with NXCLK), and which, upon occurrence of VPS during a clock period of RCLK, the regenerator 11 outputs in the next clock period regenerated data pulses RPDATA and RNDATA; depending on which polarity was indicated as its polarity inputs 12 and 13 from polarity sensor 14, which also receives the separated PDATA and NDATA inputs. For a unipolar data stream, the polarity sensor 14 is dispensed with. Both the circuit 10 and the sensor 14 are clocked by significantly faster clock which is running at a multiple N of the RCLK rate, and which may be generated by means of a free-running local oscillator 15 and frequency multiplier 16 to yield NXCLK. N may be an integer equal to 16; thus, for a nominal 50 MHz data stream rate NXCLK would be running at 800 MHz. (The actual data stream rates for presently used systems known as DS3 and STS1 are 44.736 and 51.84 MHz, respectively.) In some instances it may be desirable to have a higher rate NXCLK, where N would equal 32, or more in order to reduce jitter. However, it should be noted that NXCLK is only nominally N-times RCLK, since the local oscillator 15 is a free-running oscillator and hardly has a frequency which is equal to the incoming data stream rate. Therefore, ordinarily NXCLK divided by RCLK on average over time will not exactly equal N; and N is chosen to be 16, 32, etc. only for design efficiency and convenience. N need not be an integer either.

As may be seen from FIG. 1, the data regeneration proceeds by generating a valid pulse signal VPS indicating presence of a valid pulse in the incoming data stream, and producing a regenerated output data pulse at the occurrence of a reference clock RCLK period only when VPS was within the previous RCLK period. This method avoids the necessity of having to align the phase of RCLK such that edges of its pulses are as precisely centred on the incoming data pulses themselves. In the circuit shown in FIG. 1 the regenerator 11 outputs a regenerated data pulse for every occurrence of the VPS pulse without concern with sensitive "alignment" between VPS and RCLK pulses. Thus, the VPS "high" in effect must only "strobe" the regenerator 11 during the occurrence of an RCLK period to produce a regenerated output pulse during the next RCLK period. The VPS pulse itself has the duration of an NXCLK period.

Figure 2:
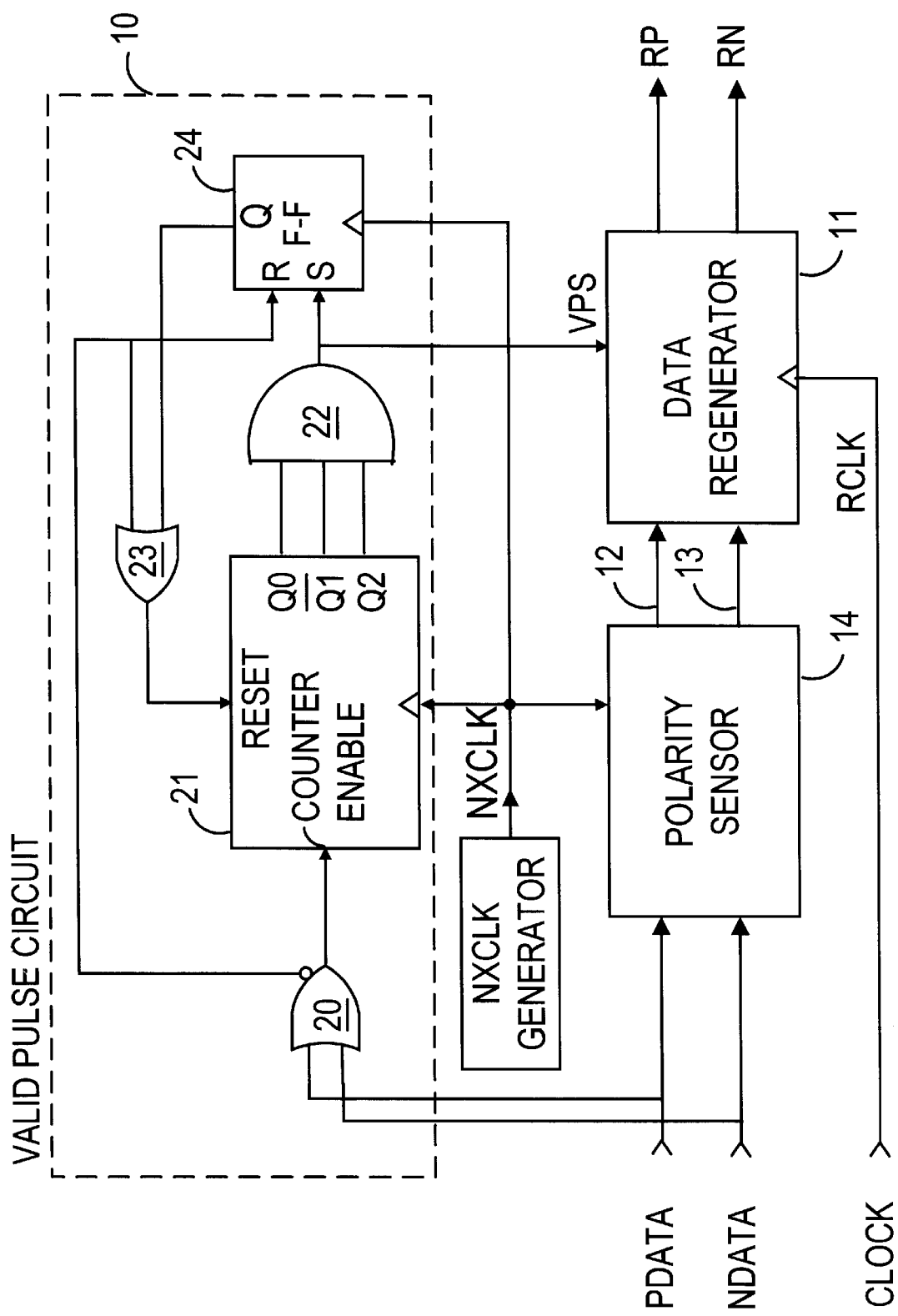
FIG. 2 is a detailed schematic of the valid pulse circuit shown in FIG. 1.

Turing now to FIG. 2 for details of the valid pulse circuit 10, it comprises an OR gate 20 to drive enable input of shift-register or counter 21, which is clocked by NXCLK, and the outputs $Q_0$, $\overline{Q_1}$ and $Q_2$ of which are input to AND gate 22, whose output yields the VPS "high" when $Q_0$, $\overline{Q_1}$ and $Q_2$ are "high", that is, when the count has reached "101" in binary notation or "5" in decimal notation. Assuming N=16, therefore, the VPS signal will be output by the AND gate 22, once an incoming PDATA and NDATA pulse has persisted for (5÷16) or some 30% of the duration of an RCLK pulse (i.e., for the duration of a well-shaped, non-degraded, data pulse). Depending on the degree of noise on the incoming data stream channel, it may be optional to increase the count to 10 or more of NXCLK pulses before producing the VPS signal. The VPS signal persists for one NXCLK period until the counter 21 is reset by the cessation of a PDATA or NDATA pulse (via $\overline{OR}$ of gate 20 and OR gate 23 or the occurrence of VPS via R-S F-F 24 and gate 23).

Figure 3:
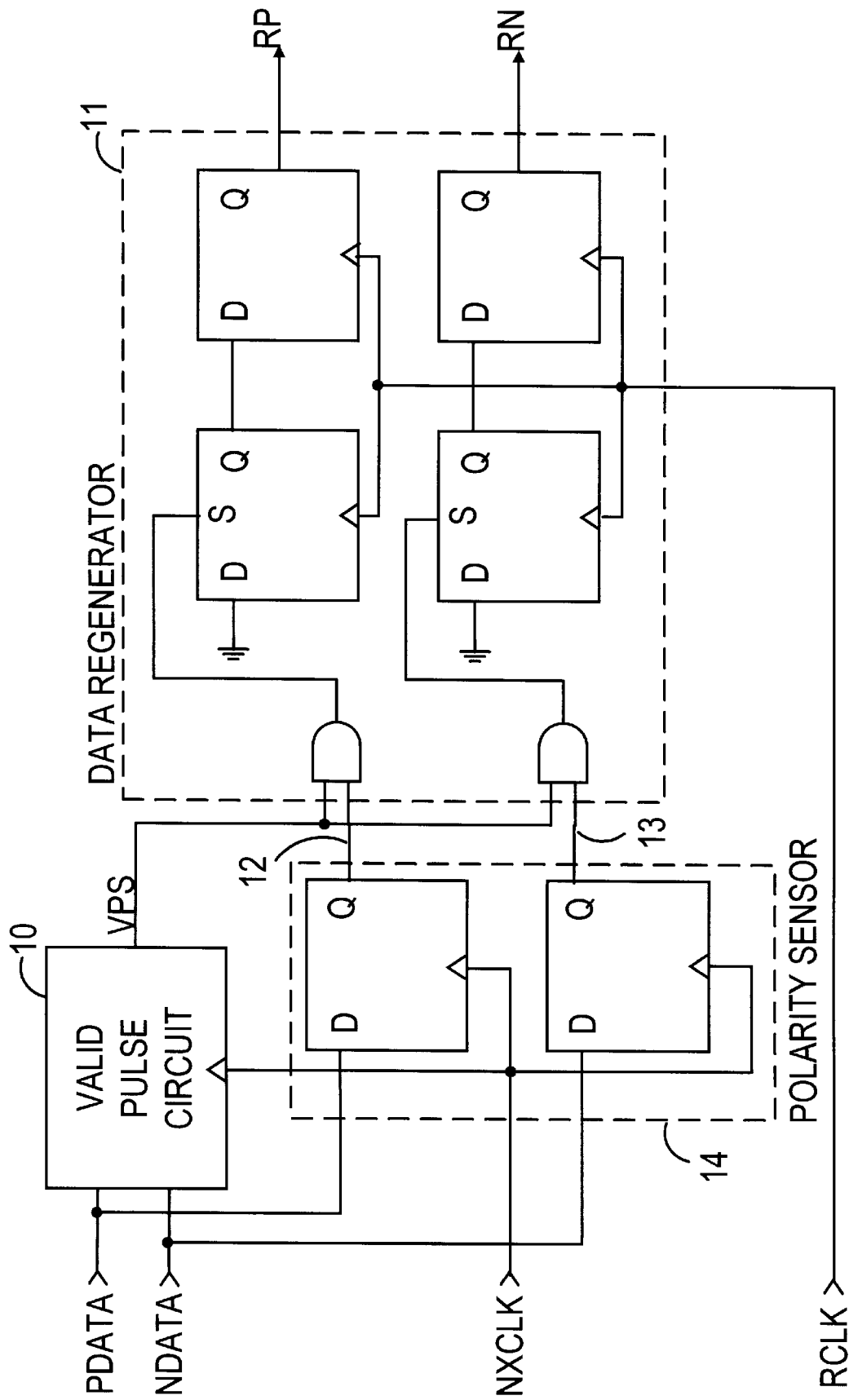
FIG. 3 is a detailed schematic of the polarity sensor and data regeneration shown in FIG. 1.

In FIG. 3, the polarity sensor 14 and the data regenerator circuits are shown in detail. Save for the manner of operation by means of the valid pulse signal VPS, they are conventional circuits for regenerating bipolar pulse streams.

I claim:

1. A method which has reduced sensitivity to clock phasing for deciding whether a pulse in a high rate data stream is or is not a valid data pulse of an incoming data stream, comprising steps of:

(a) conditioning the data stream in a predetermined manner;

(b) counting clock pulses of a clock having a clock rate that is the multiple of the incoming data stream rate;

(c) commencing the counting in step (b) only when, and as long as, a predetermined signal threshold is attained by the incoming data stream conditioned in step (a); and (d) generating a valid pulse signal (VPS) when the clock pulses counted in step (b) have attained a predetermined number.

2. A method for regenerating data pulses of an incoming data stream, as defined in claim 1, further comprising the step of:

(e) producing a regenerated data pulse of said incoming data stream, in response to a clocking pulse of a regenerated data stream clock, only upon occurrence of a VPS generated in step (d).

3. A circuit which has reduced sensitivity to clock phasing for generating a valid pulse signal (VPS) for pulses in a high rate data stream comprising: a pulse counter adapted to count up to a predetermined number at a predetermined clock rate; means for causing said counter to start counting in response to presence of a pulse exceeding a predetermined threshold; and means for resetting said counter in response to one of; said counter generating a VPS upon attaining a predetermined count, and said counter being disabled before reaching Terminal Count TC.

4. A circuit for regenerating data pulses of an incoming data stream, comprising: a circuit for generating a valid pulse signal (VPS) as defined in claim 3; and means for producing a regenerated pulse in response to presence of a VPS and a clocking pulse of a regenerated data stream clock.

5. The method as defined in claim 1, wherein step (a) further comprises the step of sensing polarities of positive and negative going pulses in the incoming data stream.

6. The method as defined in claim 5, wherein in step (c) the predetermined signal threshold is a value attained by the positive and negative going pulses.

7. The method as defined in claim 6, wherein said predetermined number in step (d) represents a duration during which the positive and negative going pulses attain said value.

8. The method as defined in claim 2, wherein step (a) results in two data streams, one positive going (PDATA) and one negative going (NDATA).

9. The method as defined in claim 8, wherein said step (a) further comprises the step of sensing polarities of the PDATA and NDATA pulses.

10. The method as defined in claim 9, wherein, in step (d), said VPS is generated only each time one of the PDATA and NDATA pulses attains a predetermined signal threshold for a predetermined percentage of a regenerated clock (RCLK) pulse duration.

11. The circuit as defined in claim 3, wherein said predetermined count corresponds to a predetermined percentage of a valid pulse duration.

12. The circuit as defined in claim 11, further comprising a polarity sensor for processing both positive going and negative going pulses.

13. The circuit as defined in claim 4, wherein said predetermined count corresponds to a predetermined percentage of a valid pulse duration.

14. The circuit as defined in claim 13, further comprising a polarity sensor for processing both positive going and negative going pulses.

* * * * *